(12) United States Patent
Masek

(10) Patent No.: US 10,340,872 B1
(45) Date of Patent: Jul. 2, 2019

(54) AUDIO FILTER DEVICE FOR ELECTRONIC INTERFERENCE WITH AUDIO SIGNALS

(71) Applicant: John Francis Masek, West Haven, UT (US)

(72) Inventor: John Francis Masek, West Haven, UT (US)

(*) Notice: Subject to any disclaimer, the term of this patent is extended or adjusted under 35 U.S.C. 154(b) by 0 days.

(21) Appl. No.: 15/944,004

(22) Filed: Apr. 3, 2018

(51) Int. Cl.
*H03H 7/06* (2006.01)
*H04B 15/02* (2006.01)
*H04R 3/04* (2006.01)

(52) U.S. Cl.
CPC .............. *H03H 7/06* (2013.01); *H04B 15/02* (2013.01); *H04R 3/04* (2013.01)

(58) Field of Classification Search
CPC ............. H03H 7/06; H04B 15/02; H04R 3/04
See application file for complete search history.

(56) References Cited

U.S. PATENT DOCUMENTS

| | | | | |
|---|---|---|---|---|
| 2008/0187160 A1* | 8/2008 | Kim | ..................... | G08C 19/00 381/375 |
| 2013/0037323 A1* | 2/2013 | Smith | ..................... | H05B 33/02 174/75 R |
| 2016/0164154 A1* | 6/2016 | Baur | ..................... | H01P 1/045 333/254 |
| 2017/0238079 A1* | 8/2017 | Smith | ..................... | H04M 1/05 381/74 |

* cited by examiner

*Primary Examiner* — Andrew L Sniezek
(74) *Attorney, Agent, or Firm* — Lee Hollaar

(57) ABSTRACT

The subject matter disclosed herein generally relates to audio signal filtering components for an audio signal as it passes through an audio cable from source to loudspeaker, but receives interference from a nearby electrical current. This electrical current includes those from electronics commonly found in cell phones, electrical lines in vehicles, or electrical lines from any nearby source that emits a magnetic field that is then picked up by the audio cable and produces a high-pitched ringing sound. The apparatus described audibly reduces the interference from this electrical current.

4 Claims, 1 Drawing Sheet

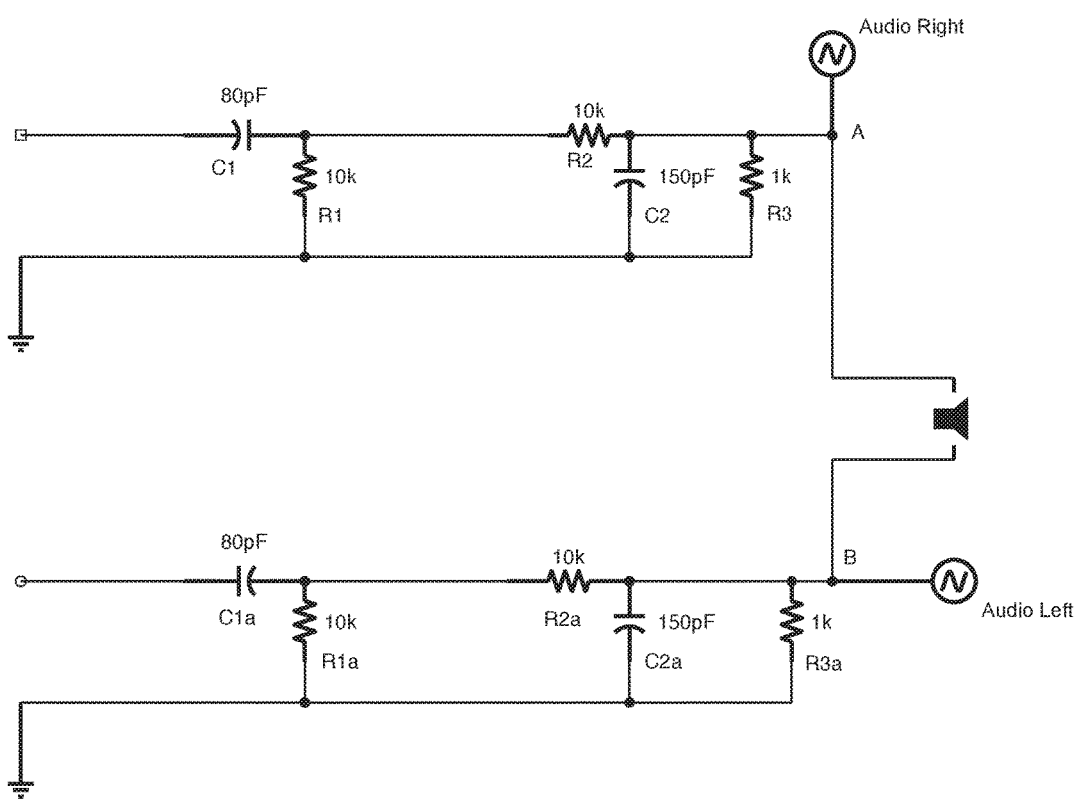

AUDIO FILTER DEVICE FOR ELECTRONIC INTERFERENCE WITH AUDIO SIGNALS

BACKGROUND

Electrical currents that run in parallel to a live audio signal cause audibly noticeable and unwanted noisy interference in audio reproduction in a speaker. Interference is also caused by the interaction of a cell phone "pinging" a cell phone tower while reproducing an audio signal. In the past, complex means of processing and filtering an audio signal have been used for the sake of accomplishing a cleaner sound, sometimes leaving a simpler means to be desired of accomplishing the same task.

BRIEF SUMMARY OF THE INVENTION

The audio filter apparatus described uses very simple means with which to operate, using only a small number of passive electronic components. It is also very small in size and could be fit into any audio cable. The apparatus described directs commonly reproduced audio frequencies through its circuitry, and then channels unwanted signal interference to "ground" on the apparatus. By so doing, this unwanted interference is reduced from the audio signal, and cleaner audio reproduction is achieved through very simple means. There is no required action on the part of the user to use the apparatus described, because it is also integrated into both the audio cable and audio connector.

BRIEF DESCRIPTION OF THE DRAWING

FIG. 1 is the circuiting schematic of the audio filtering apparatus described above.

The wires from the audio cable that carry the audio signal, specifically for Audio Left and Audio Right are attached to where an audio connector will attach to the circuit card of the apparatus, Audio Right at Point (A) and Audio Left at Point (B) respectively.

There are two identical circuits on the circuit card, one for Audio Right, and one for Audio Left, in a "stereo" configuration.

Resistor R1, having a nominal value of 10 kOhms, and capacitor C1, having a nominal value of 80 pF, form a high-pass R-C filter. Resistor R2, having a nominal value of 10 kOhms, and capacitor C2, having a nominal value of 150 pF, form a low-pass R-C filter. Combined, those filters form a passive band pass filter. Components R1a, C1a, R2a, and C2a, having the same nominal values, form another band pass filter. This band pass filter allows the circuit card to include a wide rand of audio frequencies to be filtered.

It would be understood by one with ordinary skill in the art that these nominal values are not precise, but have some tolerance, commonly plus or minus 10 percent of the nominal value.

Resistors R3 and R3a, each having a nominal value of 1 kOhms, help to direct the audio signal interference to ground.

DETAILED DESCRIPTION

When the apparatus with the electrical circuit card described in FIG. 1 is coupled and wired to the signal wires of an audio cable, the audio signal also passes through the device. The ground or shield wire from the audio cable is attached to the normal attachment point of the audio connector itself, as designated by the audio connector's manufacturer. Unwanted electrical interference is then routed to ground on the device and effectively removed before the audio signal reaches a loudspeaker.

The apparatus uses a band pass filter in its circuitry to isolate and filter frequencies commonly re-produced in music and spoken word.

No user action is required in order to enable audio filtering, since the apparatus is integrated into the cable itself, with completely passive components that require no external power to activate.

The apparatus can process both stereo left and stereo right audio signals simultaneously. The electronic circuitry on the apparatus is actually comprised of two independent circuits on one circuit card, that both share the same common ground. One of these independent circuits is for the Audio Left audio signal and the other is for Audio Right audio signal.

What is claimed is:
1. An audio filter device connected between a source of audio signals and a device with an audio signal input, comprising:
   a common ground wire to which the audio signals are referenced,
   a passive band pass filter requiring no external power, with input from the source of audio signals and output to the device with an audio signal input,
   where the band pass filter consists of a high-pass R-C filter consisting of a 80 pF capacitor and a 10 kOhm resistor, and a low-pass R-C filter consisting of a 10 kOhm resistor and a 150 pF capacitor,
   and an additional 1 kOhm resistor connected between the output of the band pass filter and the common ground wire.
2. The audio filter device of claim 1, integrated into a cable connecting the source of audio signals and the device with an audio signal input.
3. The audio filter device of claim 2, where the device with an audio signal input is a speaker or earphone.
4. The audio filter device of claim 2, where the device with an audio signal input is an audio amplifier.

* * * * *